(12) United States Patent
Mori

(10) Patent No.: US 7,736,962 B1
(45) Date of Patent: Jun. 15, 2010

(54) ADVANCED JFET WITH RELIABLE CHANNEL CONTROL AND METHOD OF MANUFACTURE

(75) Inventor: Kiyoshi Mori, San Antonio, TX (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/349,747

(22) Filed: Jan. 7, 2009

(51) Int. Cl.
*H01L 21/337* (2006.01)

(52) U.S. Cl. .................. 438/186; 438/199; 438/223; 438/238; 438/329; 438/365; 257/77; 257/192; 257/273; 257/339; 257/E21.033; 257/E21.036

(58) Field of Classification Search .................. 438/186, 438/188, 193, 505
See application file for complete search history.

(56) References Cited

U.S. PATENT DOCUMENTS 3,755,012 A * 8/1973 George et al. ................ 438/195
2008/0308816 A1 * 12/2008 Miller et al. .................. 257/76

* cited by examiner

*Primary Examiner*—N Drew Richards
*Assistant Examiner*—Kyoung Lee
(74) *Attorney, Agent, or Firm*—Baker Botts L.L.P.

(57) ABSTRACT

A junction field effect transistor comprises an insulating layer formed in a substrate. A source region of a first conductivity type is formed on the insulating layer, and a drain region of the first conductivity type is formed on the insulating layer and spaced apart from the drain region. A channel region of the first conductivity type is located between the source region and the drain region and formed on the insulating layer. A gate region of the second conductivity type surrounds all surfaces of a length of the channel region such that the channel region is embedded within the gate region.

19 Claims, 7 Drawing Sheets

B-B' CROSS-SECTION

B-B' CROSS-SECTION

TOP VIEW

A-A' CROSS-SECTION

B-B' CROSS-SECTION

B-B' CROSS-SECTION

B-B' CROSS-SECTION

B-B' CROSS-SECTION

TOP VIEW

US 7,736,962 B1

ADVANCED JFET WITH RELIABLE CHANNEL CONTROL AND METHOD OF MANUFACTURE

TECHNICAL FIELD OF THE INVENTION

The present disclosure relates generally to semiconductor devices and more particularly to an advanced JFET with reliable channel control.

BACKGROUND OF THE INVENTION

As a result of the rapid technological growth of the past several decades, transistors and other semiconductor devices have become a fundamental building block for a wide range of electronic components. Metal-oxide silicon field-effect transistors (MOSFET) have been the primary choice for transistors in many applications including general-use microprocessors, digital signal processors, application specific integrated circuits (ASICs), and various other forms of electronic devices. With the demand for electronic devices that are increasingly smaller and faster, the inclusion of the metal oxide layer from which MOSFETs derive their name creates significant limitations to further improvements in the size and operating speed of such devices. Consequently, other types of semiconductor devices enabling complementary circuits, such as junction field effect transistors (JFETs), are being researched.

SUMMARY OF THE INVENTION

In accordance with the present invention, the disadvantages and problems associated with prior junction field effect transistors have been substantially reduced or eliminated.

In one embodiment, a junction field effect transistor comprises an insulating layer formed in a substrate. A source region of a first conductivity type is formed on the insulating layer, and a drain region of the first conductivity type is formed on the insulating layer and spaced apart from the drain region. A channel region of the first conductivity type is located between the source region and the drain region and formed on the insulating layer. A gate region of the second conductivity type surrounds all surfaces of a length of the channel region such that the channel region is embedded within the gate region.

In another embodiment, a method for fabricating a junction field effect transistor is described. The JFET has an insulating layer formed in a substrate. The method comprises forming a silicon layer on the insulating layer, the silicon layer having a first conductivity type and comprising a source region, a drain region, and a channel region. Next, the method comprises masking the silicon layer to expose a portion of the channel region in a defined window, and etching at least a portion of the insulating layer under the channel region within the defined window. The method then comprises depositing a nitride layer on the silicon layer to mask the source region and the drain region and to expose at least a portion of the channel region. At least a portion of the silicon in the exposed channel region is oxidized to produce silicon dioxide, wherein the silicon dioxide surrounds the silicon of the channel region. The method continues by removing the silicon dioxide around the silicon of the channel region, and forming a gate region that surrounds the silicon of the channel region.

The following technical advantages may be achieved by some, none, or all of the embodiments of the present invention.

A gate region that surrounds all surfaces of at least a length of a channel region provides greater control over the channel region than prior JFETs that provide only a top gate region or both top and bottom gate regions. This is because the "surrounding" gate region forms a P-N junction around the entire surface of the channel region. In this regard, the surrounding gate region is able to form a depletion region around the entire surface of the channel region. Therefore, a surrounding gate region provides greater control over the current that flows between the source region and the drain region of the semiconductor device. In particular, the $I_{on}$ to $I_{off}$ ratio may be improved for a device having a surrounding gate region.

Moreover, the size of the channel region is determined by thermal oxidation and wet etch steps that provide better control, lower cost, and greater simplicity than prior techniques used to form a channel region that included multiple doping (e.g., implant or diffusion) and/or annealing steps. Because the channel region is more accurately manufactured and better controlled by a surrounding gate region, the drive current can be increased, the leakage currents can be reduced, and the overall stability of the transistor can be improved. Moreover, these structures and manufacturing processes can be applied to multiple channel region JFETs to further increase drive current and operation speed.

These and other advantages, features, and objects of the present invention will be more readily understood in view of the following description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1A:
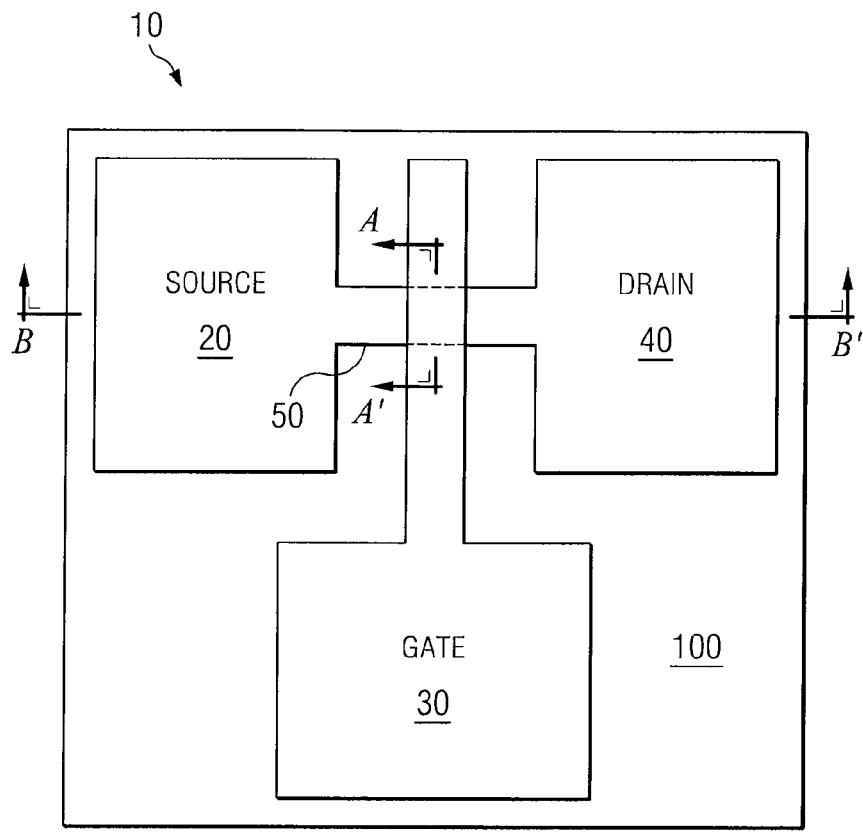
FIGS. 1A-1C illustrate one embodiment of an advanced JFET with reliable channel control.

FIG. 1A illustrates a cutaway top view of a semiconductor device 10, according to certain embodiments. As shown in FIG. 1A, device 10 may comprise a source region 20, a surrounding gate region 30, a drain region 40, and a channel region 50 formed on an insulating layer (not shown) in a substrate 100. Further details regarding semiconductor device 10 are provided with respect to FIG. 1B taken along lines B-B' of FIG. 1A, and with respect to FIG. 1C taken along lines A-A' of FIG. 1A.

Figure 1B:
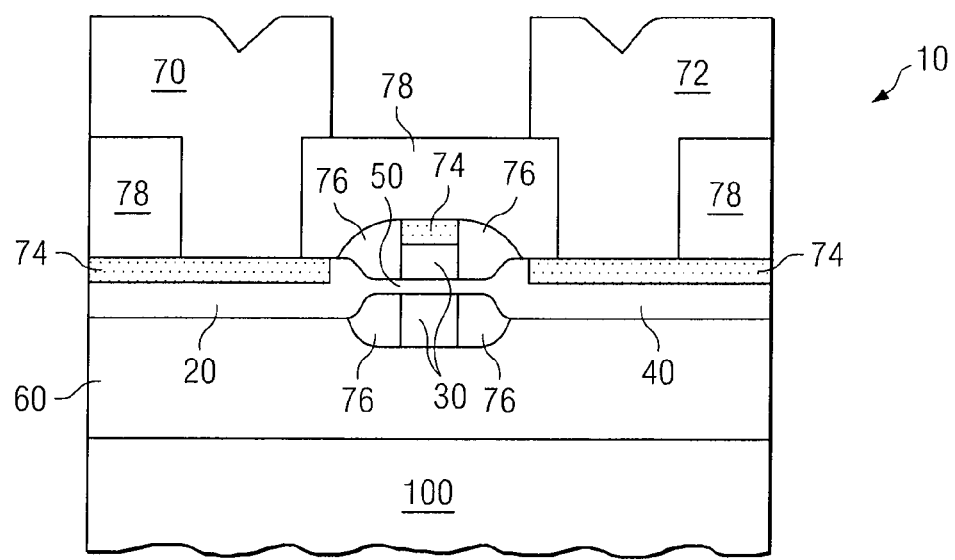

FIG. 1B illustrates semiconductor device 10 taken along lines B-B' of FIG. 1A. As shown in FIG. 1B, device 10 may comprise a source region 20, a surrounding gate region 30, a drain region 40, and a channel region 50 formed in a silicon layer on insulating layer 60. Source region 20 and drain region 40 are coupled to external circuitry using metal contact regions 70 and 72, respectively. Separate layers of silicide 74 formed on source region 20, a portion of surrounding gate region 30, and drain region 40 provide improved conductivity for device 10. Oxide 76 is adjacent to surrounding gate region 30. An interlayer dielectric material 78 separates gate region 30 from metal contact regions 70 and 72. The regions illustrated in FIG. 1B are not necessarily drawn to scale. In some embodiments, semiconductor device 10 is a junction field effect transistor (JFET). When appropriate voltages are applied to the terminals of semiconductor device 10, a current flows through channel region 50 between source region 20 and drain region 40.

Substrate 100 represents bulk semiconductor material on which insulating layer 60 can be formed. Substrate 100 may be formed of any suitable semiconductor material, such as materials from Group IV, or a compound semiconductor from Group III and Group V of the periodic table. In particular embodiments, substrate 100 is formed of single-crystal silicon. In other embodiments, substrate 100 is an alloy of silicon and at least one other material. For example, substrate 100 may be formed of silicon-germanium. In yet other embodiments, substrate 100 is formed of single-crystal germanium. Substrate 100 may have a particular conductivity type, such as p-type or n-type. In particular embodiments, semiconductor device 10 may represent a portion of substrate 100 that is shared by a plurality of different semiconductor devices (not illustrated in FIG. 1B).

Insulating layer 60 may comprise silicon dioxide, sapphire, or any other suitable insulating material. The remainder of this disclosure will be described with reference to an embodiment of semiconductor device 10 in which silicon dioxide is used as the insulating layer 60. Insulating layer 60 may be formed to have any suitable depth using any suitable fabrication techniques commonly known to those of skill in the art. In one embodiment, insulating layer 60 has a depth of 150 nm. Insulating layer 60 generally isolates the active regions of device 10 from substrate 100. This lowers the parasitic capacitance of device 10, which improves power consumption at matched performance.

Channel region 50 provides a path to conduct current between source region 20 and drain region 40. Channel region 50 is formed by the addition of dopants to a silicon layer formed on insulating layer 60. For example, the dopants may represent particles of n-type doping material such as antimony, arsenic, phosphorous, or any other appropriate n-type dopant. Alternatively, the dopants may represent particles of p-type doping material such as boron, gallium, indium, or any other suitable p-type dopant. Where the channel region 50 is doped with n-type impurities, conduction between drain 40 and source 20 is dominated by electrons when appropriate voltage is applied to the gate and drain terminals of device 10 with respect to the source. Where channel region 50 is doped with p-type impurities, conduction between drain 40 and source 20 is dominated by holes when appropriate voltage is applied to gate and drain terminals of device 10 with respect to the source.

The doping concentration for channel region 50 may range from $1E+17$ atoms/cm$^3$ to $1E+20$ atoms/cm$^3$. In conventional JFETs, the doping concentration of the channel region is made lower than the source and drain regions in order to reduce the size of the channel region. However, the size of channel region 50 in device 10 is determined largely by the oxidation process described in detail later, not primarily by the doping concentration of the channel region 50. Thus, an advantage of device 10 is that it can have any suitable doping concentration for channel region 50 while still having a suitably sized channel region 50. Moreover, the doping concentration for channel region 50 may be maintained such that device 10 operates in an enhancement mode, with a current flowing between drain region 40 and source region 20 when a positive voltage differential is applied between source region 20 and gate region 30.

As will be described in greater detail below, the manufacturing process can be accurately controlled to achieve a channel region 50 with an appropriately sized width and depth. For example, the width of channel region 50 can be accurately controlled to be in a range from 5 to 20 nm. Similarly, the depth of channel region 50 can be accurately controlled to be in a range from 5 to 20 nm. In one embodiment, the channel region 50 is manufactured to have a width of 10 nm and a depth of 10 nm. A 10 nm square channel region 50 provides reliable control over the on-current and off-current of device 10.

Source region 20 and drain region 40 each comprise regions formed by the addition of dopants to the silicon layer formed on insulating layer 60. Thus, for an n-channel device 10, source region 20 and drain region 40 are doped with n-type impurities. For a p-channel device 10, source region 20 and drain region 40 are doped with p-type impurities. In particular embodiments, source region 20 and drain region 40 have a doping concentration at or higher than $1E+19$ atoms/cm$^3$. Source region 20 and drain region 40 are each capped by a layer of silicide 74, as illustrated in FIG. 1B. In one embodiment, source region 20 and drain region 40 each have a depth of between 50 and 100 nm, inclusive of the layer of silicide 74.

Gate region 30 may be formed by depositing polysilicon, as described in greater detail below, and doping it with a second type of dopant. As a result, gate region 30 has a second conductivity type. Thus, for an n-channel device 10, gate region 30 is doped with p-type impurities. For a p-channel device 10, gate region 30 is doped with n-type impurities. In particular embodiments, gate region 30 is doped with the second type of dopant to a concentration at or higher than $1E+18$ atoms/cm$^3$. As described further below, when a voltage is applied to gate region 30, the applied voltage alters the conductivity of the neighboring channel region 50, thereby facilitating or impeding the flow of current between source region 20 and drain region 40.

Gate region 30 surrounds all surfaces of a length of channel region 50, and may therefore be referred to as a surrounding gate region 30. In one embodiment, the surrounding gate region 30 has a thickness ranging from 60 to 80 nm. A surrounding gate region 30 provides greater control over the channel region 50 than prior JFETs with only a top gate region or both top and bottom gate regions. This is because the surrounding gate region forms a P-N junction around the entire surface of the channel region 50. In this regard, surrounding gate region 30 is able to form a depletion region around the entire surface of the channel region 50. Therefore, a surrounding gate region 30 provides greater control over the current that flows between source region 20 and drain region 40 of semiconductor device 10. In particular, the $I_{on}$ to $I_{off}$ ratio may be improved for a device 10 having a surrounding gate region 30.

Connection regions 70 and 72 comprise structures that provide an ohmic connection to source region 20 and drain region 40, respectively. In particular embodiments, connection regions 70 and 72 may be coplanar. Coplanar connection regions 70 and 72 may simplify the manufacturing and packaging of semiconductor device 10. Connection regions 70 and 72 may be formed of any suitable metal such as, for example, aluminum or copper. Silicide 74 may comprise, for example, cobalt silicide, nickel silicide, titanium silicide, molybdenum silicide, etc. Interlayer dielectric material 78 comprises dielectric material used to electrically separate closely spaced interconnect lines arranged in several levels (multilevel metallization) in an integrated circuit. ILD material 78 generally has a low dielectric constant, k, to minimize capacitive coupling between adjacent metal lines.

In operation, channel region 50 provides a voltage-controlled conductivity path between source region 20 and drain region 40. More specifically, a voltage differential between gate region 30 and source region 20 (referred to herein as $V_{GS}$) controls channel region 50 by increasing or decreasing a width of a depletion region formed within channel region 50. The depletion region defines an area within channel region 50 in which holes and electrons have depleted semiconductor device 10. Because the depletion region lacks charge carriers, it will impede the flow of current between source region 20 and drain region 40 by forming an energy barrier. Moreover, as the depletion region expands or recedes, the portion of channel region 50 through which current can flow grows or shrinks, respectively. As a result, the conductivity of channel region 50 increases and decreases as $V_{GS}$ changes, and semiconductor device 10 may operate as a voltage-controlled current regulator. As described above, surrounding gate region 30 is able to form a depletion region around the entire surface of channel region 50. Therefore, a surrounding gate region 30 provides greater control over the current that flows between source region 20 and drain region 40 of semiconductor device 10.

Semiconductor device 10 can comprise either a depletion mode device or an enhancement mode device. In depletion mode, when $V_{GS}>0$, the depletion region pinches off channel region 50 preventing current from flowing between source region 20 and drain region 40. When $V_{GS}\leqq0$, the depletion region recedes to a point that a current flows between source region 20 and drain region 40 through channel region 50. In enhancement mode, when $V_{GS}\leqq0$, the depletion region pinches off channel region 50 preventing current from flowing between source region 20 and drain region 40. When $V_{GS}>0$, the depletion region recedes to a point that a current flows between source region 20 and drain region 40 through channel region 50 when a positive voltage differential is applied between source region 20 and drain region 40 (referred to herein as $V_{DS}$).

Figure 1C:
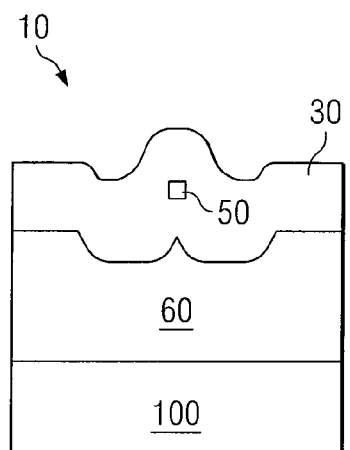

FIG. 1C illustrates semiconductor device 10 taken along lines A-A' of FIG. 1A. As shown in FIG. 1C, gate region 30 surrounds all surfaces of channel region 50. In this regard, channel region 50 is embedded within the gate region 30.

Figure 2:
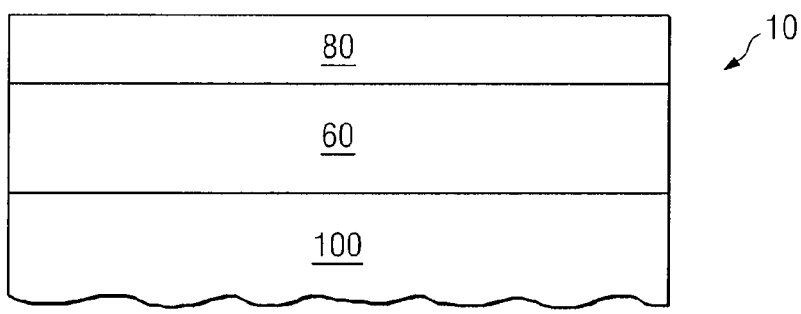

FIGS. 2-12 illustrate one example method of fabricating semiconductor device 10. The various elements of device 10 depicted in FIGS. 2-12 are not necessarily drawn to scale. FIG. 2 illustrates a cross-sectional view of device 10 after particular steps during fabrication have been completed to form a silicon layer 80 on insulting layer 60 in substrate 100. Thus, device 10 is formed using a silicon-on-insulator architecture. Silicon layer 80 may be doped in multiple process steps to form n-type and/or p-type regions. A p-type doping is appropriate to form p-type source region 20, drain region 40, and channel region 50. The dopants may represent acceptors such as boron, gallium, indium, or any other suitable p-type dopant. An n-type doping is appropriate to form an n-type source region 20, drain region 40, and channel region 50. The dopants may represent donors such as antimony, arsenic, phosphorous, or any other appropriate n-type dopant. In one embodiment, the thickness of insulating layer is approximately 150 nm, and the thickness of silicon layer 80 is approximately 70 nm.

In one embodiment, channel region 50 is formed using ion implantation at a suitable implant energy (e.g., 1 to 100 kEV) and dosage (e.g., 5E+12 atoms/cm$^2$ to 5E14 atoms/cm$^2$) of appropriately doped impurities to achieve a final doping concentration ranging from 1E+17 atoms/cm$^3$ to 1E+20 atoms/cm$^3$. In one embodiment, source region 20 and drain region 40 are formed using ion implantation at a suitable implant energy (e.g., 1 to 100 kEV) and dosage (e.g., 1E+13 atoms/cm$^2$ to 1E16 atoms/cm$^2$) of appropriately doped impurities to achieve a final doping concentration at or higher than 1E+19 atoms/cm$^3$. The device 10 is annealed at a suitably high temperature for a suitable length of time given the material properties of the various regions of device 10.

Figure 3B:
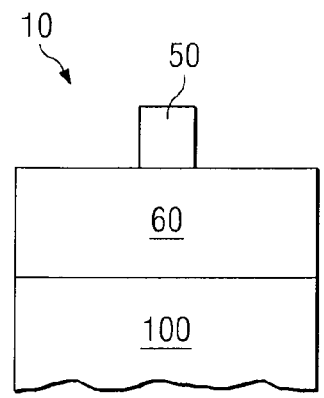
FIGS. 2-12 illustrate one method of fabricating the JFET of FIG. 1.
Figure 3A:
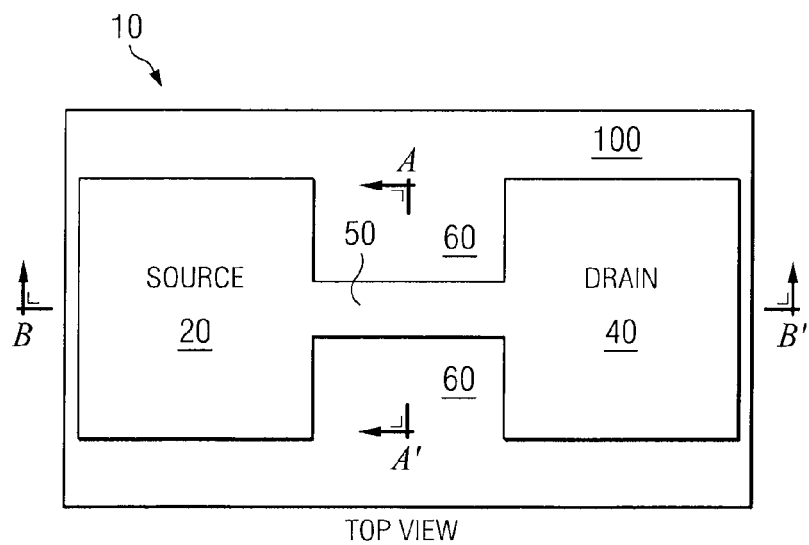

FIG. 3A illustrates a top view of semiconductor device 10. A photoresist mask may be formed on suitable portions of silicon layer 80 where source region 20, drain region 40, and channel region 50 will be formed. The photoresist mask may be formed using any suitable photolithography process such as, for example, by applying a layer of photoresist, selectively exposing the photoresist, and removing the unexposed photoresist. Next, the unmasked portions of silicon layer 60 may be etched using any suitable etching process to define the source region 20, drain region 40, and channel region 50, as illustrated in FIG. 3A.

FIG. 3B illustrates semiconductor device 10 taken along lines A-A' of FIG. 3A after the photolithographic and etching process described above are performed.

Figure 4:
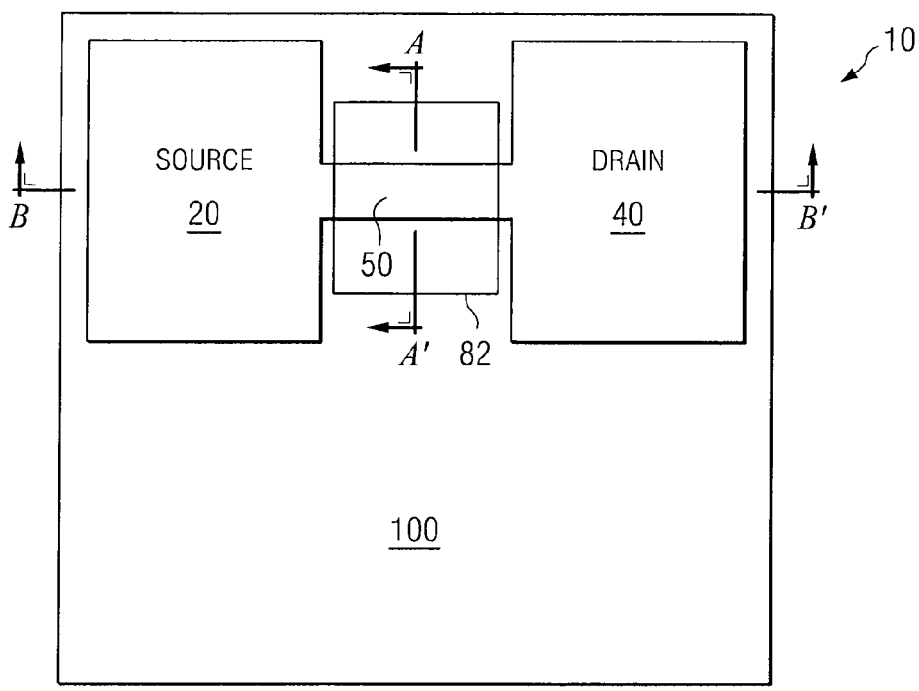

FIG. 4 illustrates a top view of semiconductor device 10. A photoresist mask may be formed on suitable portions of silicon layer 80 to cover appropriate portions of source region 20, drain region 40, and channel region 50. However, the mask exposes some portions of channel region 50 and some portions of insulating layer 60 within a defined window 82. In one embodiment, the mask exposes the silicon dioxide of insulating layer 60 within window 82. Next, an isotropic etch is performed to target the silicon dioxide under the exposed portions of channel region 50. In this regard, the target etch undercuts the silicon dioxide under the exposed portions of channel region 50. In other embodiments where the insulating layer 60 is formed using different materials, an etching process may be used to target that material under the exposed portion of channel region 50.

Figure 5A:
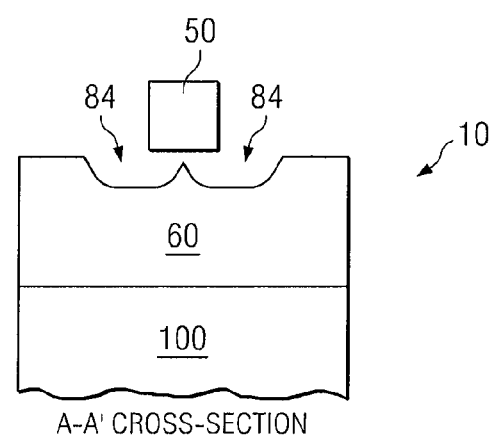

FIG. 5A illustrates semiconductor device 10 taken along lines A-A' of FIG. 4 after portions of the insulating layer 60 under channel region 50 have been etched according to the isotropic etch process described above. The etched portions of insulting layer 60 are referred to as gap 84. Gap 84 provides space under the channel region 50 for oxygen to oxidize the silicon in channel region 50 during a thermal oxidation process described in greater detail below.

Figure 5B:
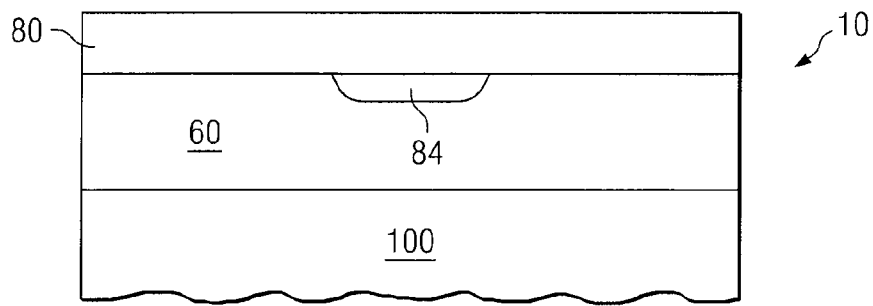

FIG. 5B illustrates semiconductor device 10 taken along lines B-B' of FIG. 4 after portions of the silicon dioxide under silicon channel region 50 have been etched according to the isotropic etch process described above. The etched portions of insulting layer 60 are referred to as gap 84 in FIG. 5B.

Figure 6:
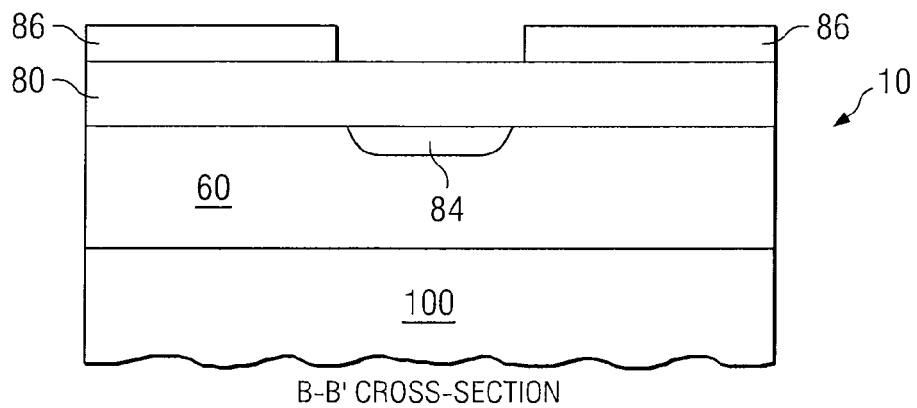

FIG. 6 illustrates a layer of nitride 86 deposited on silicon layer 80. Nitride 86 is patterned and used as a mask to cover the source region 20 and drain region 40, and to expose a portion of channel region 50.

Next, a thermal oxidation process is performed to consume a portion of the silicon in channel region 50 that is exposed by the layer of nitride 86. Thermal oxidation forces an oxidizing agent to diffuse into the wafer at high temperature and react with it. Thermal oxidation may be applied to different materials, and this embodiment considers the oxidation of the silicon in channel region 50 to form silicon dioxide 88. Thermal oxidation of silicon is usually performed at a temperature between 800 and 1200° C., resulting in a so-called High Temperature Oxide layer (HTO). It may use either water vapor (steam) or molecular oxygen as the oxidant; it is consequently called either wet or dry oxidation. Thermal oxidation incorporates silicon consumed from the exposed channel region 50 and oxygen supplied from the ambient. Thus, it grows in multiple directions.

The amount of silicon that is consumed and, therefore, the desired remaining size of channel region 50, can be determining by calculating the appropriate parameters for the thermal oxidation process. For example, at 800° C., 10 nm of silicon can be oxidized per every 30 minutes of the thermal oxidation process. Thus, in one embodiment, if the silicon in channel region 50 starts at roughly 70 nm square and it is desired to achieve final dimensions of 10 nm square, then the thermal oxidation process may be performed on device 10 for 90 minutes at 800° C. This will oxidize roughly 30 nm of silicon on each side of channel region 50 for a total of 60 nm of the original 70 nm, leaving behind roughly 10 nm of silicon in the exposed portion of channel region 50. Other parameters for the thermal oxidation process may be used to achieve a final thickness of channel region 50 anywhere between 5-20 nm square. For example, the thermal oxidation process may be performed at a predetermined temperature and for a predetermined amount of time to consume a predetermined amount of silicon in the channel region 50. In this regard, the processes described above provide an accurate mechanism to create a thin channel region 50 for use in semiconductor device 10. This technique overcomes prior techniques for forming a transistor channel which relies upon multiple doping and anneal steps which are subject to high variability.

Figure 7A:
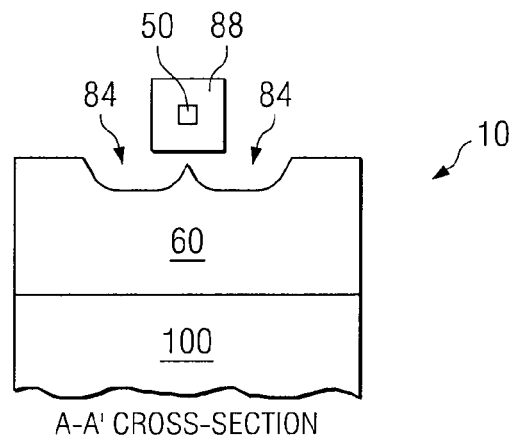

FIG. 7A illustrates semiconductor device 10 taken along lines A-A' after a suitable thermal oxidation process is performed and nitride 86 is removed. In this embodiment, the silicon in channel region 50 that remains after thermal oxidation is roughly 10 nm square. Moreover, the silicon dioxide surrounding the silicon of channel region 50 is roughly 30 nm on any side of the channel region 50.

Figure 7B:
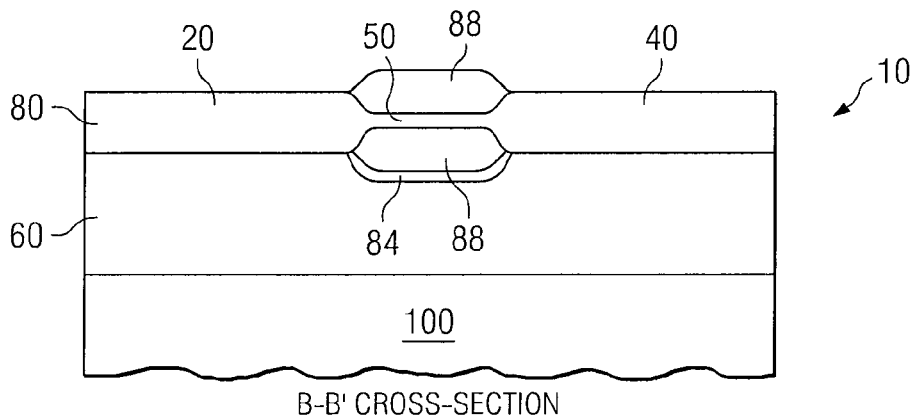

FIG. 7B illustrates semiconductor device 10 taken along lines B-B' after a suitable thermal oxidation process is performed and nitride 86 is removed. FIG. 7B shows that the silicon in source region 20 and drain region 40 remain relatively undisturbed by the thermal oxidation process because of the layer of nitride 86 used to mask these regions in FIG. 6 above.

Figure 8A:
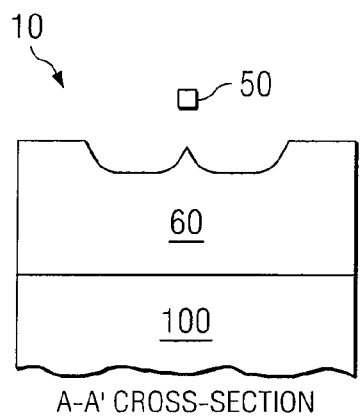
Figure 8B:
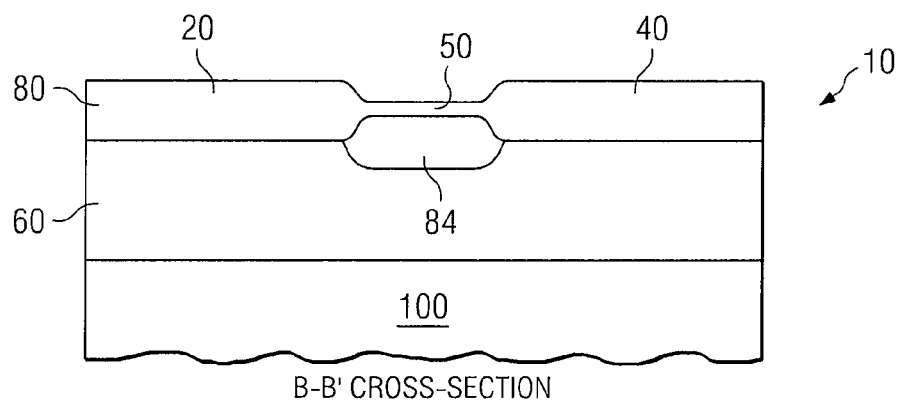

Next, any suitable etching process, such as wet etching, is performed to remove the silicon dioxide that was formed around the silicon in channel region 50 during the thermal oxidation process. FIG. 8A illustrates semiconductor device 10 taken along lines A-A' after the etching process is performed. FIG. 8B illustrates semiconductor device 10 taken along lines B-B' after the etching process is performed. Both FIGS. 8A and 8B show that the silicon dioxide surrounding the silicon in channel region 50 that was illustrated in FIGS. 7A and 7B is removed by the etching process.

Figure 9A:
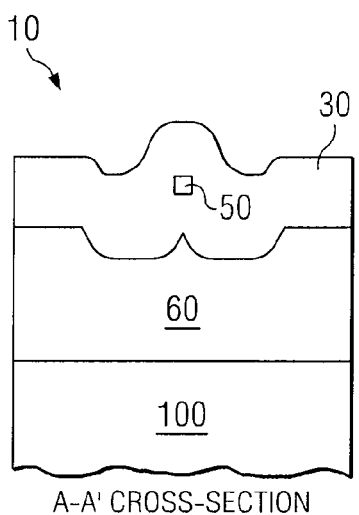
Figure 9B:
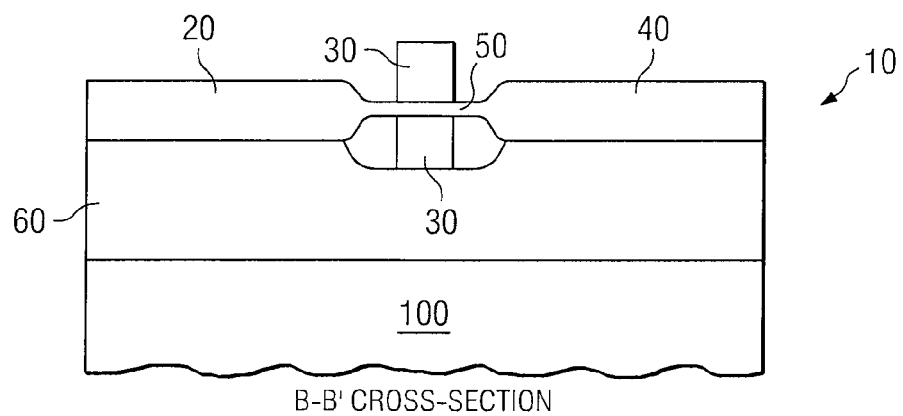

Next, a low pressure chemical vapor deposition (LPCVD) is performed to deposit polysilicon around channel region 50. After the polysilicon is deposited around channel region 50, it is doped with appropriate impurities. For a device 10 having an n-type channel region 50, the polysilicon is doped with p-type impurities. For a device 10 having a p-type channel region 50, the polysilicon is doped with n-type impurities. Next, a suitable lithographic and etching process is then performed on the polysilicon to define and form the gate region 30. FIG. 9A illustrates semiconductor device 10 taken along lines A-A' after the polysilicon is deposited and patterned. FIG. 9A shows that the polysilicon of gate region 30 surrounds the silicon of channel region 50 such that channel region 50 is embedded within gate region 30. FIG. 9B illustrates semiconductor device 10 taken along lines B-B'. Some prior semiconductor devices 10 use only top and/or bottom gates to control the channel region 50. The gate region 30 of semiconductor device 10 in this disclosure provides better control of channel region 50 because gate region 30 surrounds the channel region 50 from all sides, not just the top and/or bottom of the channel region 50.

Figure 10:
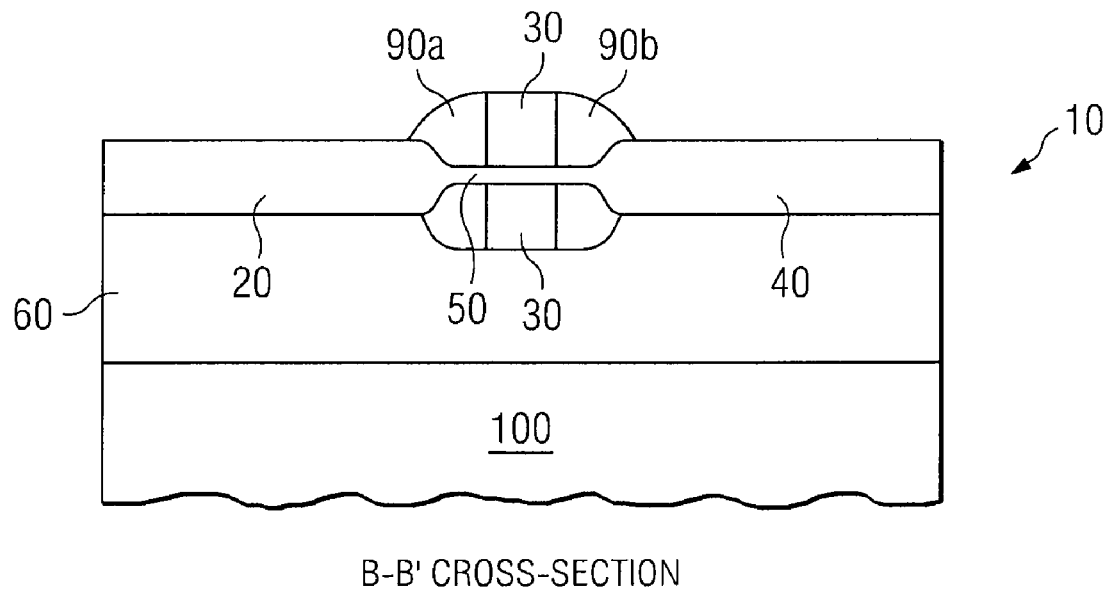
Figure 11:
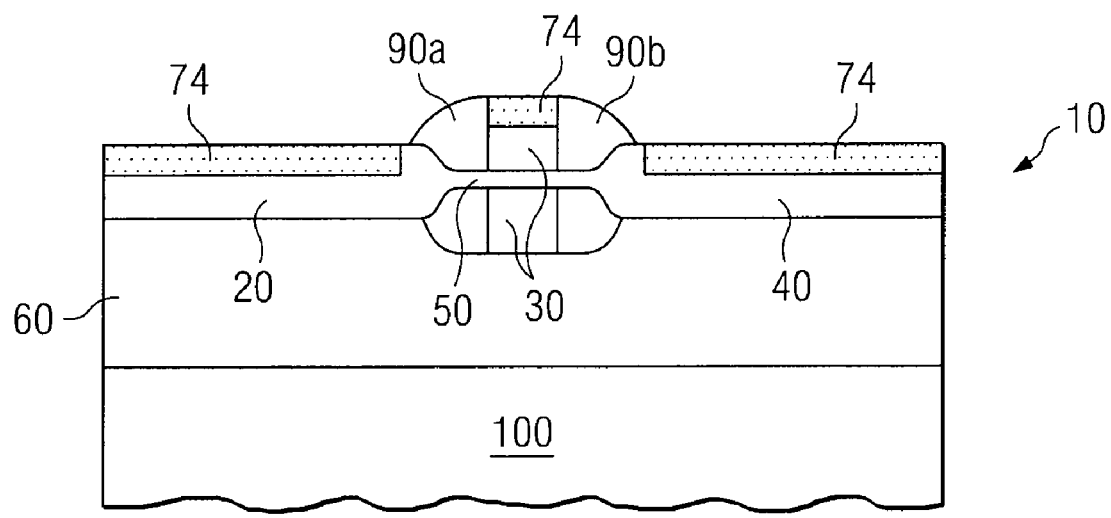

FIG. 10 illustrates a cross-section of semiconductor device 10 after an oxide deposition is performed to create sidewalls 90a-90b. The oxide may be deposited using an LPCVD process and selectively etched to form sidewalls 90a-90b. Next, a silicide deposition is performed as illustrated in FIG. 11. In one embodiment, a layer of cobalt is applied across the surface of the device 10 using any suitable deposition technique such as, for example, physical vapor deposition or chemical vapor deposition. The cobalt will react with the silicon in source region 20 and drain region 40, and with the polysilicon in gate region 30. This reaction is induced by heating the entire device at a temperature ranging from 500-700° C. for a time ranging from 30 seconds to 10 minutes depending upon the thickness of cobalt silicide desired to be formed. The unreacted cobalt is removed by selective etching. Although this disclosure is described with respect to forming silicide 74 using cobalt, it should be understood that silicide 74 may be formed by thermally reacting any suitable material (e.g., cobalt, nickel, titanium, molybdenum, etc.) with the silicon and/or polysilicon of source region 20, drain region 40, and gate region 30.

Figure 12:
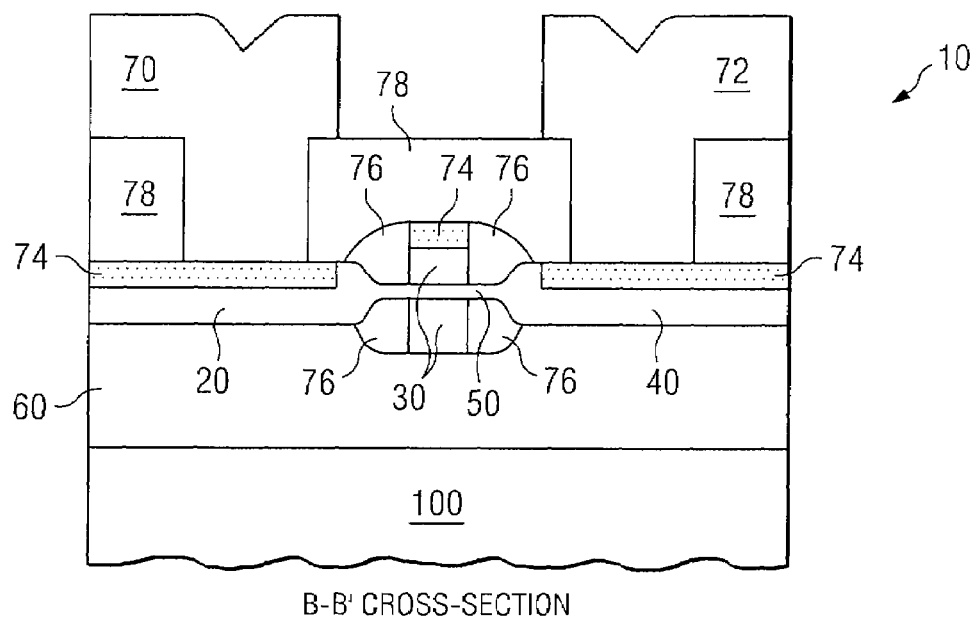

FIG. 12 illustrates the formation of an interlayer dielectric material 78. Next, contact holes are formed in the material 78 to reach silicide 74 above each of source region 20 and drain region 40. These contact holes may be formed by appropriately masking and etching material 78. The contact holes are then filled with an appropriate metal, such as, for example, tungsten, molybdenum, or titanium, to form metal contact regions 70 and 72. Next, additional steps are completed to form the remainder of device 10 using suitable fabrication techniques, including but not limited to patterning and depositing metal interconnects.

Figure 13:
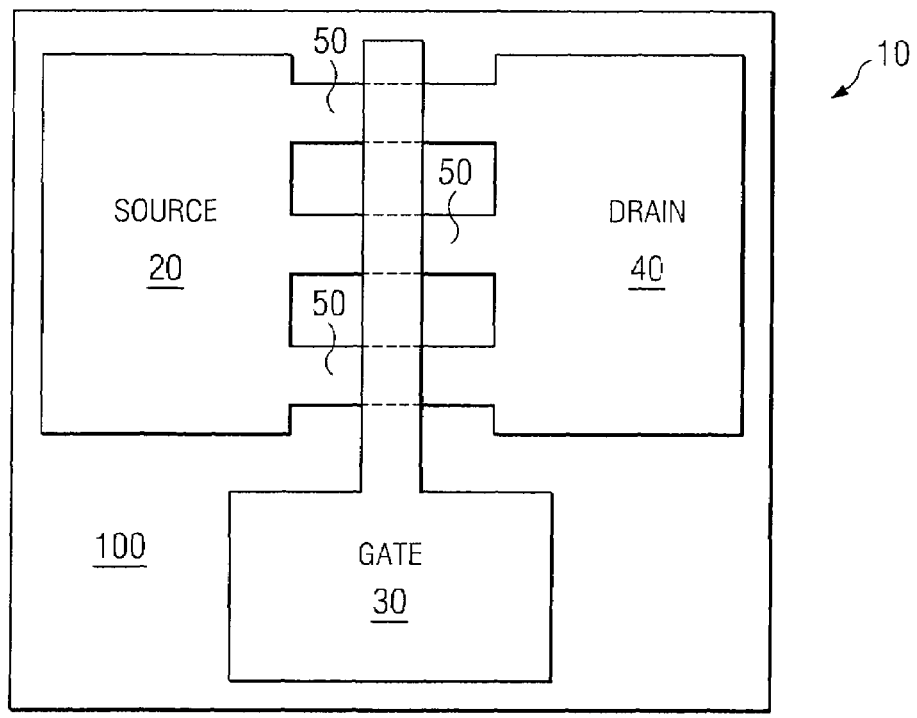
FIG. 13 illustrates one embodiment of a top view of a multi-channel version of the JFET of FIG. 1.

FIG. 13 illustrates a top view of one embodiment of semiconductor device 10 having multiple active regions, such as multiple channel regions 50 between source regions 20 and drain regions 40. Each of the multiple channel regions 50 is controlled by a common gate region 30 that surrounds the multiple channel regions 50. This device 10 may be formed using similar fabrication techniques described above for device 10, except that the various steps may be performed for each of the multiple active regions of this device. In one embodiment, the fabrication techniques described above may be performed on each of the multiple active regions of this device 10 substantially simultaneously to achieve an efficient manufacturing process. In other embodiments, the fabrication techniques may be performed on different active regions individually, especially where one active region has a slight variation in its manufacturing process or in the final structure.

Although the present invention has been described in detail, it should be understood that various changes, substitutions and alterations can be made hereto without departing from the scope of the invention as defined by the appended claims.

What is claimed is:

1. A method for fabricating a junction field effect transistor having an insulating layer formed in a substrate, the method comprising:
   forming a silicon layer on the insulating layer, the silicon layer having a first conductivity type and comprising a source region, a drain region, and a channel region;
   masking the silicon layer to expose a portion of the channel region in a defined window;
   etching at least a portion of the insulating layer under the channel region within the defined window;
   depositing a nitride layer on the silicon layer to mask the source region and the drain region and to expose at least a portion of the channel region;

oxidizing at least a portion of the silicon in the exposed channel region to produce silicon dioxide, wherein the silicon dioxide surrounds the silicon of the channel region;

removing the silicon dioxide around the silicon of the channel region; and forming a gate region that surrounds the silicon of the channel region.

2. The method of claim 1, further comprising:

depositing oxide on sidewalls of at least a portion of the gate region;

forming separate regions of silicide on each of the source region, the gate region, and the drain region;

depositing an interlayer dielectric material over the transistor;

forming a first contact hole through the interlayer dielectric material to reach the silicide over the source region;

forming a second contact hole through the interlayer dielectric to reach the silicide over the drain region; and filling the first and second contact holes with metal to form a first metal contact region in ohmic contact with the source region and a second metal contact region in ohmic contact with the drain region.

3. The method of claim 1, wherein forming the gate region comprises:

depositing polysilicon to surround the silicon of the channel region;

doping the polysilicon a second conductivity; and etching the polysilicon to define the gate region.

4. The method of claim 1, wherein etching the insulating layer is performed using an isotropic etch.

5. The method of claim 1, wherein the insulating layer comprises silicon dioxide.

6. The method of claim 1, wherein oxidizing the silicon in the exposed channel region comprises performing a thermal oxidation process to consume a portion of the silicon in the channel region.

7. The method of claim 6, wherein the thermal oxidation process is performed at a predetermined temperature and for a predetermined amount of time to consume a predetermined amount of silicon in the channel region.

8. The method of claim 6, wherein:

the silicon in the channel region is approximately 60-80 nm thick prior to the thermal oxidation;

the thermal oxidation of the silicon in the channel region is performed at 800° C. for ninety minutes.

9. The method of claim 2, wherein forming the silicide comprises:

depositing a layer of metal on the source region, the gate region, and the drain region;

thermally reacting the metal with the silicon of the source region and the drain region, and with the polysilicon of the gate region.

10. The method of claim 9, wherein the metal comprises at least one of cobalt, nickel, titanium, and molybdenum.

11. The method of claim 1, wherein the first conductivity type comprises n-type and the second conductivity type comprises p-type.

12. The method of claim 1, wherein the first conductivity type comprises p-type and the second conductivity type comprises n-type.

13. A junction field effect transistor, comprising:

an insulating layer formed in a substrate;

a source region of a first conductivity type formed on the insulating layer;

a layer of silicide on the source region;

a drain region of the first conductivity type formed on the insulating layer and spaced apart from the drain region;

a layer of silicide on the drain region;

a channel region of the first conductivity type which is located between the source region and the drain region and formed on the insulating layer, wherein the channel region has a width that ranges from 5-20 nm and a depth that ranges from 5-20 nm;

a gate region of the second conductivity type surrounding all surfaces of a length of the channel region such that the channel region is embedded within the gate region;

a layer of silicide on the gate region;

a first metal contact region in ohmic contact with the layer of silicide on the source region; and a second metal contact region in ohmic contact with the layer of silicide on the drain region.

14. A junction field effect transistor, comprising:

an insulating layer formed in a substrate;

a source region of a first conductivity type formed on the insulating layer;

a drain region of the first conductivity type formed on the insulating layer and spaced apart from the drain region;

a channel region of the first conductivity type which is located between the source region and the drain region and formed on the insulating layer;

a gate region of the second conductivity type surrounding all surfaces of a length of the channel region such that the channel region is embedded within the gate region;

a first metal contact region in ohmic contact with a layer of silicide on the source region; and a second metal contact region in ohmic contact with a layer of silicide on the drain region.

15. The JFET of claim 14, wherein the first conductivity type comprises n-type and the second conductivity type comprises p-type.

16. The JFET of claim 14, wherein the first conductivity type comprises p-type and the second conductivity type comprises n-type.

17. The JFET of claim 14, wherein the channel region has a depth that ranges from 5-20 nm.

18. The JFET of claim 14, wherein the channel region has a width that ranges from 5-20 nm.

19. The JFET of claim 14, wherein the insulating layer comprises silicon dioxide.

* * * * *